(12) United States Patent
Chen

(10) Patent No.: US 12,322,740 B2
(45) Date of Patent: Jun. 3, 2025

(54) SEMICONDUCTOR PACKAGE, WEARABLE DEVICE, AND TEMPERATURE DETECTION METHOD

(71) Applicant: Advanced Semiconductor Engineering, Inc., Kaohsiung (TW)

(72) Inventor: Ying-Chung Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 179 days.

(21) Appl. No.: 17/349,784

(22) Filed: Jun. 16, 2021

(65) Prior Publication Data

US 2022/0406762 A1 Dec. 22, 2022

(51) Int. Cl.
| | |
|---|---|
| *H01L 25/16* | (2023.01) |
| *H01L 23/00* | (2006.01) |
| *H01L 23/31* | (2006.01) |
| *H01L 23/34* | (2006.01) |
| *H04R 1/10* | (2006.01) |
| *H04R 29/00* | (2006.01) |
| *G01C 3/08* | (2006.01) |

(Continued)

(52) U.S. Cl.
CPC ........ *H01L 25/167* (2013.01); *H01L 23/3121* (2013.01); *H01L 23/34* (2013.01); *H01L 24/16* (2013.01); *H01L 24/48* (2013.01); *H04R 1/1016* (2013.01); *H04R 1/1041* (2013.01); *H04R 1/1075* (2013.01); *H04R 29/001* (2013.01); *G01C 3/08* (2013.01); *G01J 5/12* (2013.01); *H01L 2224/16145* (2013.01); *H01L 2224/48225* (2013.01); *H01L 2924/12041* (2013.01); *H01L 2924/12042* (2013.01); *H01L 2924/12043* (2013.01); *H04R 1/023* (2013.01)

(58) Field of Classification Search
CPC . H01L 25/167; H01L 25/117; H01L 25/0756; H01L 25/0753; H01L 25/071; H04R 1/1016

See application file for complete search history.

(56) References Cited

U.S. PATENT DOCUMENTS

| | | | | |
|---|---|---|---|---|
| 6,196,714 | B1 * | 3/2001 | Bellifemine | G01J 5/04 |
| | | | | 374/161 |
| 8,580,613 | B2 * | 11/2013 | Feiertag | G01L 19/141 |
| | | | | 438/109 |

(Continued)

FOREIGN PATENT DOCUMENTS

| | | | |
|---|---|---|---|
| CN | 102663944 B | * | 4/2014 |
| CN | 206590896 U | * | 10/2017 |

(Continued)

*Primary Examiner* — Michele Fan
(74) *Attorney, Agent, or Firm* — FOLEY & LARDNER LLP

(57) ABSTRACT

A semiconductor package device, a wearable device, and a temperature detection method are provided. The semiconductor package includes a substrate, an optical module, and a temperature module. The optical module is disposed on the substrate. The temperature module is disposed on the substrate and adjacent to the optical module. The temperature module comprises a semiconductor element and a temperature sensor stacked on the semiconductor element. The optical module is configured to detect a distance between the optical module and an object.

5 Claims, 15 Drawing Sheets

(51) Int. Cl.
   *G01J 5/12*     (2006.01)
   *H04R 1/02*    (2006.01)

(56) References Cited

U.S. PATENT DOCUMENTS

| | | | |
|---|---|---|---|
| 10,306,350 B1 * | 5/2019 | Lin | G01S 17/04 |
| 10,827,249 B1 | 11/2020 | Pine et al. | |
| 2010/0133722 A1 * | 6/2010 | Watanabe | H01L 21/56 |
| | | | 264/272.17 |
| 2011/0057108 A1 * | 3/2011 | Yao | G01S 17/48 |
| | | | 257/E31.108 |
| 2013/0317772 A1 * | 11/2013 | Dawson | G01L 27/002 |
| | | | 702/85 |
| 2014/0021491 A1 * | 1/2014 | Meng | H01L 33/54 |
| | | | 257/82 |
| 2014/0070337 A1 * | 3/2014 | Besling | H01L 21/77 |
| | | | 438/51 |
| 2017/0078785 A1 * | 3/2017 | Qian | H04R 1/406 |
| 2017/0108357 A1 * | 4/2017 | Chang | G01D 5/34 |
| 2018/0114737 A1 * | 4/2018 | Choi | G11C 11/40626 |
| 2018/0269347 A1 * | 9/2018 | Chen | H01L 31/02005 |
| 2019/0082974 A1 * | 3/2019 | LeBoeuf | A61B 5/4812 |
| 2019/0346305 A1 * | 11/2019 | Ho | G01J 1/4204 |
| 2022/0269348 A1 * | 8/2022 | Yoshida | G06F 3/03547 |
| 2022/0386015 A1 * | 12/2022 | Li | H04R 1/1016 |

FOREIGN PATENT DOCUMENTS

| | | | | |
|---|---|---|---|---|
| CN | 209608795 U | * | 11/2019 | |
| CN | 111863639 A | * | 10/2020 | |
| CN | 112050947 A | * | 12/2020 | |
| WO | WO-2010084550 A1 | * | 7/2010 | H01L 23/34 |
| WO | WO-2021005952 A1 | * | 1/2021 | |

* cited by examiner

SEMICONDUCTOR PACKAGE, WEARABLE DEVICE, AND TEMPERATURE DETECTION METHOD

BACKGROUND

1. Field of the Disclosure

The present disclosure relates to a semiconductor package, wearable device, and a temperature detection method.

2. Description of the Related Art

Wearable devices accompanied with sensing functions have become popular. However, to provide sufficient number of functions, the ever-shrinking size of the wearable devices may be compromised. A semiconductor package that allows integration of numerous components under the constraint of footprint and power consumption is under high demand.

SUMMARY

In some embodiments, a semiconductor package includes a substrate, an optical module, and a temperature module. The optical module is disposed on the substrate. The temperature module is disposed on the substrate and adjacent to the optical module. The temperature module comprises a semiconductor element and a temperature sensor stacked on the semiconductor element. The optical module is configured to detect a distance between the optical module and an object.

In some embodiments, a semiconductor package device includes a substrate, a light emitter, a light receiver, and a temperature module. The light emitter is disposed on the substrate. The light emitter is configured to emit a first light. The light receiver is disposed on the substrate. The temperature module is disposed between the light emitter and the light receiver. The temperature module is configured to prevent a portion of the first light from reaching the light receiver.

In some embodiments, a wearable device includes a housing and a semiconductor package. The housing has an opening. The housing includes a substrate, an optical module, and a temperature module. The substrate is disposed in the housing. The optical module is disposed on the substrate and has a sensing surface. The temperature module is disposed on the substrate and has a sensing surface. The sensing surface of the optical module and the sensing surface of the temperature module face the opening of the housing.

In some embodiments, a temperature detection method comprises: detecting a temperature of a temperature sensor in a semiconductor package; generating a data by the temperature sensor associated with a temperature of an object; measuring a distance between the semiconductor package and the object; and calibrating the detected temperature of the object based on the data, the detected temperature of the temperature sensor, and the measured distance.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
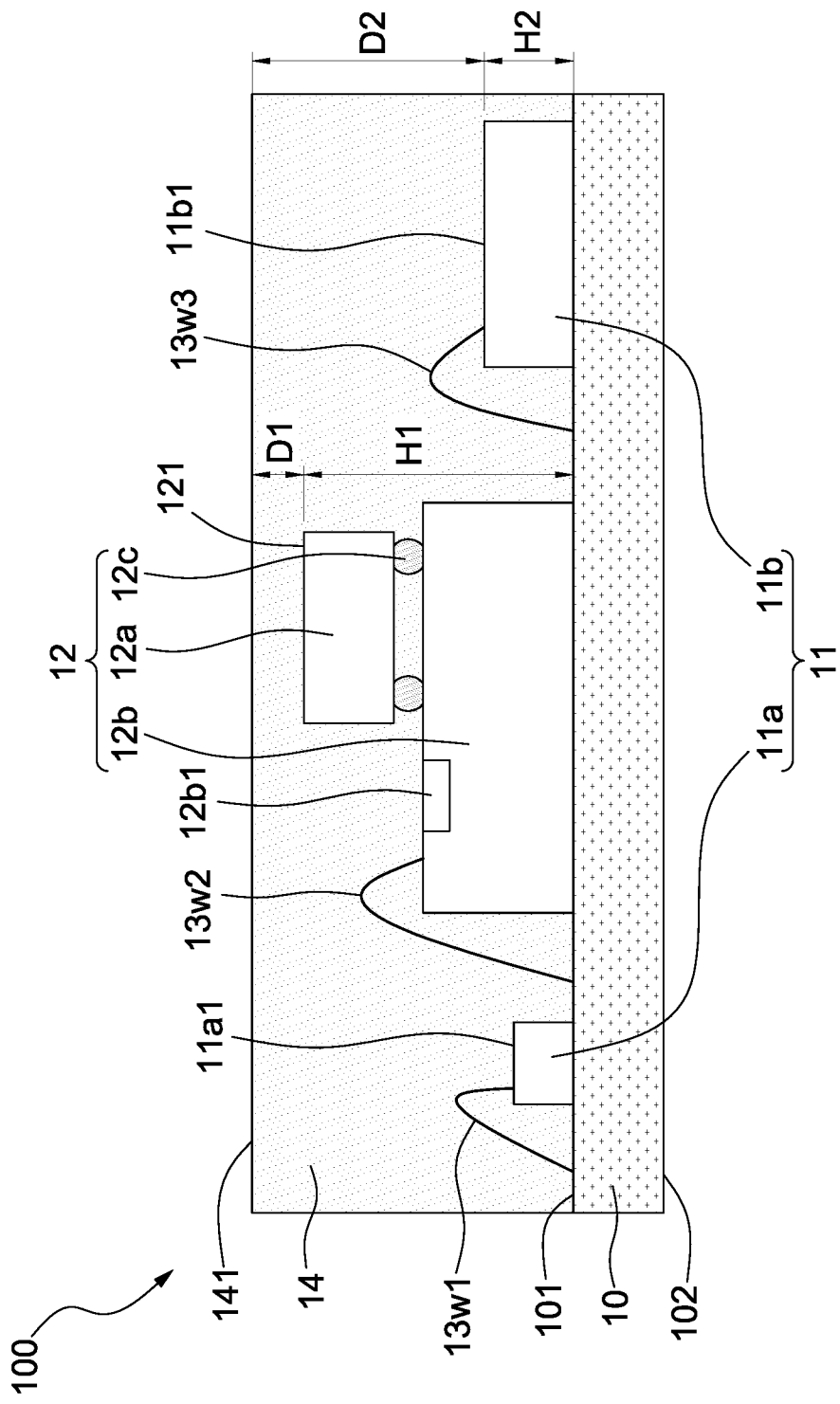
FIG. 1 illustrates a cross-sectional view of a semiconductor package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
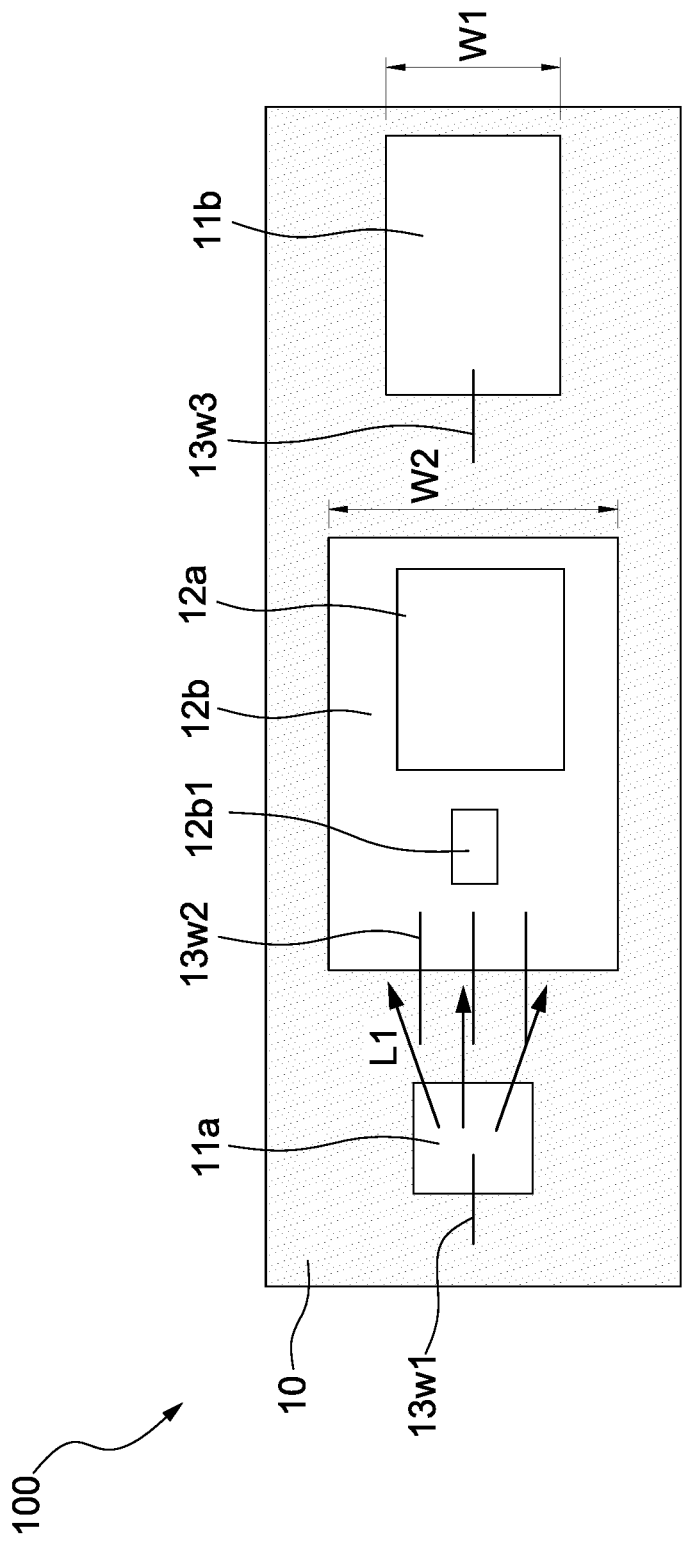
FIG. 2 illustrates a top view of a semiconductor package according to some embodiments of the present disclosure.

FIG. 1 illustrates a cross-sectional view of a semiconductor package 100 according to some embodiments of the present disclosure. FIG. 2 illustrates a top view of the semiconductor package 100 according to some embodiments of the present disclosure. The semiconductor package 100 includes a substrate 10, an optical module 11, a temperature module 12, a plurality of wires 13w1, a plurality of wires 13w2, a plurality of wires 13w3, and an encapsulant 14.

The substrate 10 may have a surface 101 and a surface 102 opposite to the surface 101. The substrate 10 may have a plurality of conductive pads on the surface 101. The pluralities of wires 13w1, 13w2, and 13w3 may be attached to or bonded on the plurality of conductive pads. The substrate 10 may include one or more circuit layers electrically connected to the plurality of conductive pads. The circuit layers of the substrate 10 may electrically connect electrical components attached to or bonded on the substrate 10. Furthermore, the substrate 10 may include, for example, a printed circuit board (PCB), such as a paper-based copper foil laminate, a composite copper foil laminate, or a polymer-impregnated glass-fiber-based copper foil laminate.

The optical module 11 may be disposed on the substrate 10 (e.g., the surface 101). The optical module 11 may be configured to detect a distance between the optical module 11 and an object. The optical module 11 may include a light emitter 11a and a light receiver 11b. The light emitter 11a may be disposed on the surface 101 of the substrate 10. The light emitter may be configured to emit one or more lights. The light emitter 11a may be configured to emit a light with wavelength from about 0.8 µm to about 1.5 µm. The light emitter 11a may include, for example, but is not limited to, a light emitting diode, laser, or the like. The light emitter 11a may be electrically connected to the substrate 10 through the wire 13w1. The light receiver 11b may be disposed on the surface 101 of the substrate 10. The light receiver 11b may be configured to receive one or more lights. The light receiver 11b may be configured to receive one or more lights with a wavelength from about 0.8 µm to about 1.5 µm. The light receiver 11b may include, for example, but is not limited to, a photodiode or an optical sensor, such as a CMOS sensor. The light receiver 11b may be electrically connected to the substrate 10 through the wire 13w3. The light receiver 11b may be configured to generate an electrical signal (e.g., a voltage or current) in response to a received light. The optical module 15 may be a proximity sensor.

The temperature module 12 may be disposed on the substrate 10 (e.g., the surface 101). The temperature module 12 may be electrically connected to the substrate 10 through the wire 13w2. The temperature module 12 may be disposed adjacent to the optical module 11. Furthermore, the temperature module 12 may be disposed between the light receiver 11a and the light receiver 11b. The temperature module 12 may include a temperature sensor 12a, a semiconductor element 12b (e.g., a semiconductor die), and a plurality of connection elements 12c. The temperature sensor 12a may be stacked on the semiconductor element 12b. The temperature sensor 12a may include an infrared sensor. The temperature sensor 12a may be configured to sense one or more lights with a wavelength from about 2 µm to about 10 µm. The temperature sensor 12a may be configured to generate a data (e.g., an electrical current signal) in response to a received light. The connection elements 12c may be disposed between the temperature sensor 12a and the semiconductor element 12b. The temperature sensor 12a may be electrically connected to the semiconductor element 12b through the connection elements 12c. The temperature sensor 12a may be configured to transmit the data (e.g., the electrical current signal) associated with a received light to the semiconductor element 12b. The semiconductor element 12b may be electrically connected to the substrate 10.

The semiconductor element 12b may be electrically connected to the optical module 11 through the circuit layers of the substrate 10. The semiconductor element 12 may be configured to receive the distance information detected by the optical module 11. The semiconductor element 12 may be configured to control the light radiation of the light emitter 11a. The semiconductor element 12 may be configured to receive the electrical signals from the light receiver 12b. The semiconductor element 12 may be configured to generate distance information between the optical module 11 and an object based on the light radiation of the light emitter 11a and the electrical signals from the light receiver 11b. The semiconductor element 12b may include an integrated circuit, a controller, a micro-controller unit (MCU), a memory, etc. The semiconductor element 12b may include one or more semiconductor chips, each of which process different signals from the temperature sensor 12a, the optical module 11, and/or the substrate 10. The height of the semiconductor element 12b may be less than about 0.05 mm.

Referring to FIG. 2, the light emitter 11a may be configured to emit a light L1 which may have a portion laterally leaking toward the light receiver 11b. The light emitter 11a and the light receiver 11b of the optical module 11 may have a width W1, and the semiconductor element 12b of the temperature module 12 may have a width W2. The width W2 may be greater than the width W1, such that the temperature module 12 may be configured to prevent the laterally-leaking portion of the light L1 emitted by the light emitter 11a from directly reaching the light receiver 11b. In other words, the temperature module 12 may be configured to block the laterally-leaking portion of the light L1. In some embodiments, the size of the light emitter 11a may be less than 0.1 mm*0.1 mm and the size of the light emitter 11a may be less than 0.1 mm*0.1 mm. The size of the semiconductor element 12b may be less than 0.2 mm*0.2 mm.

The semiconductor element 12b may include a temperature chip 12b1 disposed adjacent to the temperature sensor 12a. The temperature chip 12b1 may be configured to detect a temperature of the temperature sensor 12a. In some embodiments, the temperature chip 12b1 may be configured to detect a temperature which is representative of all the elements of the semiconductor package 100. Since the temperature chip 12b1 is disposed in proximal to the temperature sensor 12a, the temperature detected by the temperature chip 12b1 may be a more accurate representation of the temperature of the temperature sensor 12a. However, there may be a slight difference between the temperature detected by the temperature chip 12b1 and the actual temperature of the temperature sensor 12a.

The temperature sensor 12a may include, for example, but is not limited to, a photodiode or a thermopile sensor. The temperature sensor 12a may be dedicated to detecting an infrared light. The size of the temperature sensor 12a may be less than 0.1 mm*0.1 mm. The height of the temperature sensor 12a may be less than about 0.2 mm.

The encapsulant 14 may be disposed on the surface 101 of the substrate 10. The encapsulant 14 may cover the optical module 11 and the temperature module 12. The encapsulant 14 may have a top surface 141 away from the surface 101 of the substrate 10. A distance D2 between the top surface 141 of the encapsulant 14 and the optical module 11 is greater than a distance D1 between the top surface 141 of the encapsulant 14 and the temperature module 12. Referring to FIG. 1, the temperature module 12 may have a height H1 from a surface of the substrate and the optical module 11 may have height H2 from a surface of the substrate. The height H1 of the temperature module 12 may be greater than the height H2 of the optical module 11. The height H1 may be less than about 0.25 mm. The height H2 may be less than about 0.05 mm.

As shown in FIG. 1, the light emitter 11a of the optical module 11 may have a sensing surface 11a1 away from the surface 101 of the substrate 10. The light receiver 11b of the optical module 11 may have a sensing surface 11b1 away from the surface 101 of the substrate 10. The temperature module 12 may have a sensing surface 121 away from the surface 101 of the substrate 10. The sensing surfaces 11a1, 11b1, and 121 may be covered by the encapsulant. The encapsulant 14 may include a transparent material, such that the lights emitted from the sensing surface 11a1 of the light emitter 11a can penetrate through the encapsulant 14 with an acceptable extent of loss. The encapsulant 14 may include a transparent material, such that the sensing surface 11b1 of the light receiver 11b and the sensing surface 121 of the temperature module 12 may receive lights from an object.

The encapsulant 14 may include an epoxy resin with or without fillers, a molding compound (e.g., an epoxy molding compound or other molding compound), a polyimide, a phenolic compound or material, a material with a silicone dispersed therein, or a combination thereof.

Figure 3:
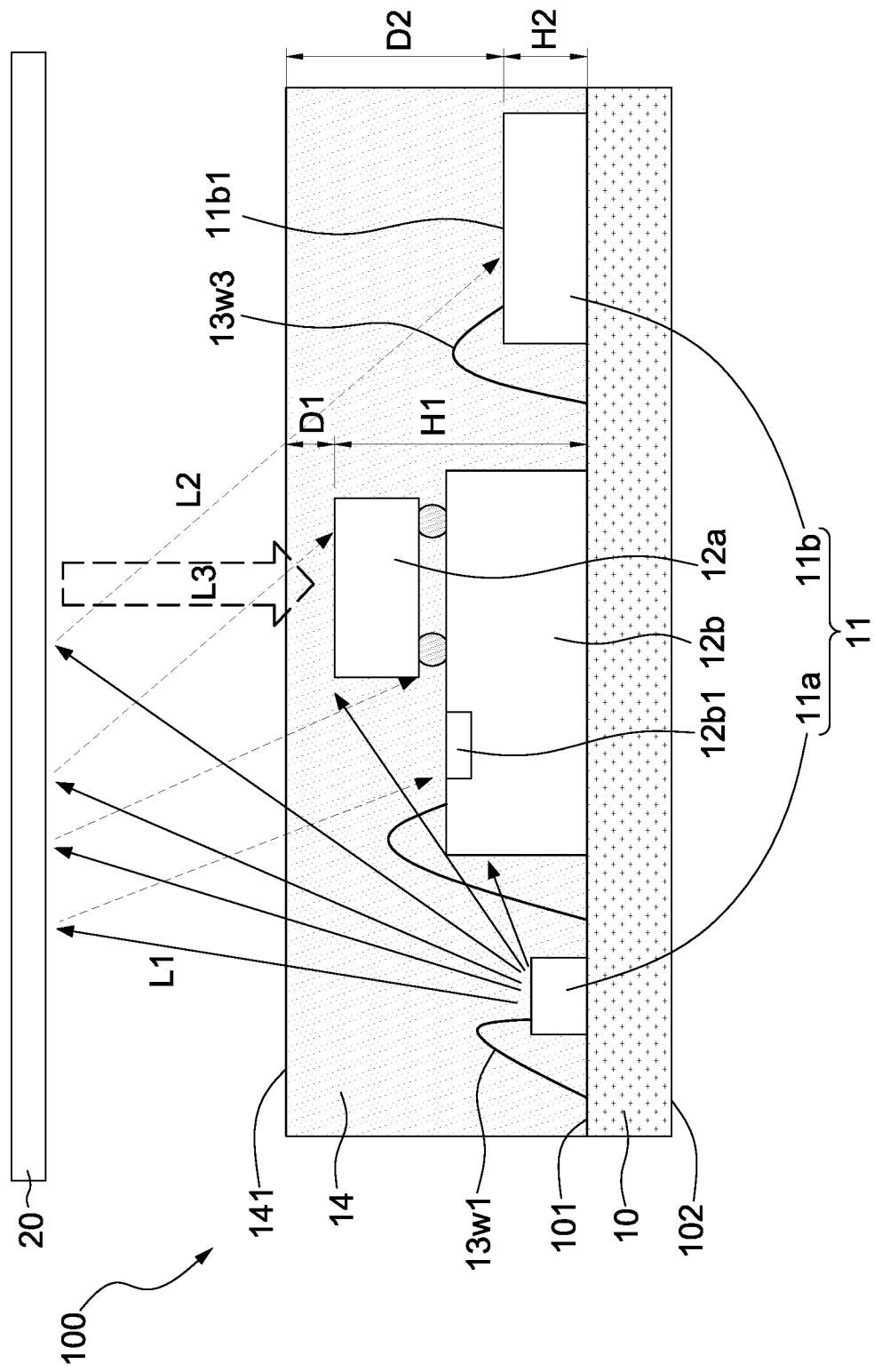
FIG. 3 illustrates an interaction diagram of lights between a semiconductor package and an object according to some embodiments of the present disclosure.

FIG. 3 illustrates an interaction diagram of lights between the semiconductor package 100 and an object 20 according to some embodiments of the present disclosure. The object 20 may be spaced apart from the semiconductor package 100. The object 20 may be any article in the surrounding area of the semiconductor package 100. In some embodiments, the object 20 may be a user's body part, such as an ear canal, wrist, arm, eye, thigh, leg, etc.

As shown in FIG. 3, the light emitter 11a may be configured to emit a light L1 with a wavelength from about 0.8 μm to about 1.5 μm. The light receiver 11b may be configured to receive a light L2 reflected by the object 20 outside the semiconductor package 100 and from the light L1. The light L2 may have a wavelength from about 0.8 μm to about 1.5 μm. The light L1 may have a wide beam angle. A first portion of the light L1 may arrive at a surface 201 of the object 20. The first portion of the light L1 may be reflected by the surface 201 of the object 20 to be a light L2. A second portion of the light L1 may arrive at the temperature module 12. Furthermore, a portion of the light L2 may arrive at the temperature module 12. The temperature module 12 may be opaque to the light L1 and the light L2 and, as previously discussed, the height H1 of the temperature module 12 is greater than the height H2 of the optical module 11. Thus, the temperature module 12 disposed between the light emitter 11a and the light receiver 11b may be a barrier therebetween. The light emitter 11a and the light receiver 11b may be spaced apart from each other by the temperature module 12. The temperature module 12 may be configured to prevent a portion of the light from reaching the light receiver 11b. The light L1 is free from reaching the light receiver 11a and the light L2 is free from reaching the light emitter 11b. As such, the temperature module 12 may significantly reduce the cross-talk between the light emitter 11a and the light receiver 11b. The semiconductor element 12b is insensitive to the light L1 and the light L2. The temperature sensor 12a configured to detect lights with a wavelength from about 2 μm to about 10 μm. Hence, the function of the temperature module 12 would not be impacted by the light L1 and the light L2. The compact arrangement of the optical module 11 and the temperature module 12 can reduce the size of the semiconductor package 100.

Figure 4:
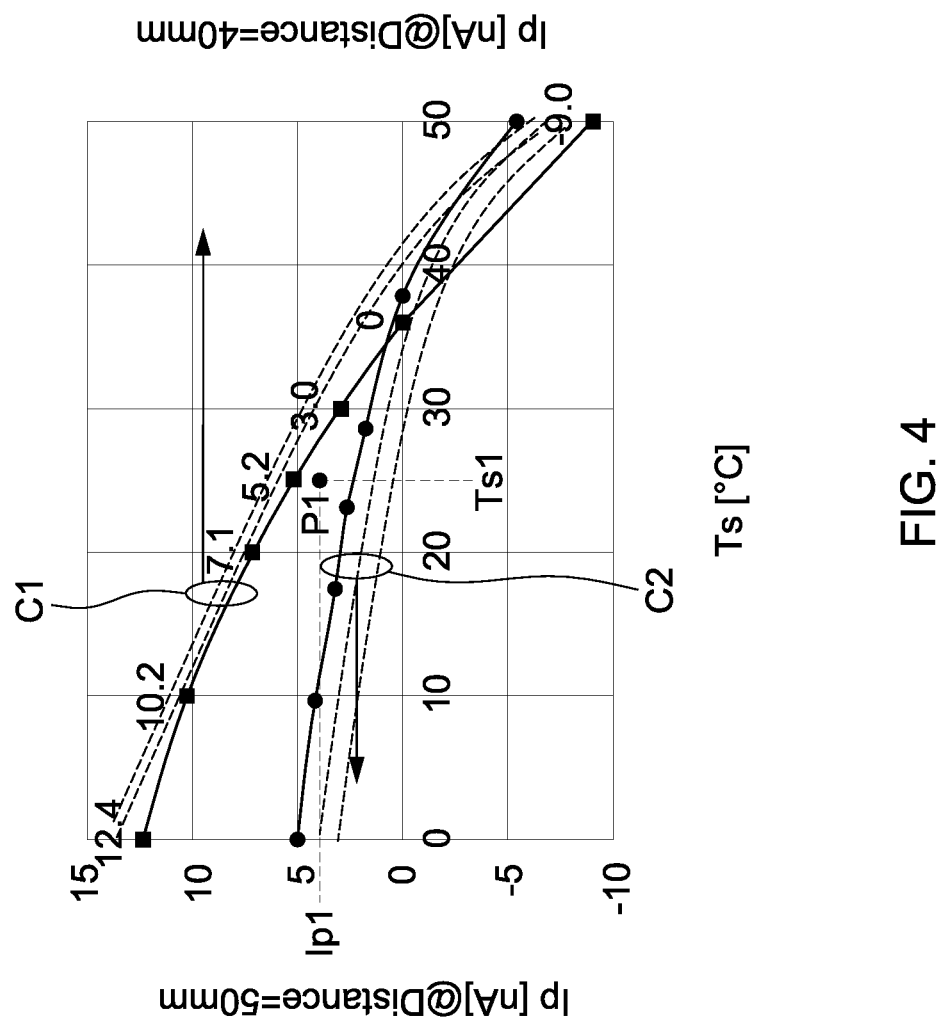
FIG. 4 illustrates a current-temperature plot according to some embodiments of the present disclosure.

FIG. 4 illustrates a current-temperature plot according to some embodiments of the present disclosure. The x-axis represents the temperature Ts of the temperature sensor 12a detected by the temperature chip 12b1. The y-axis represents the electrical current signal Ip generated by the temperature sensor 12a. The semiconductor element 12b may include a database storing a library of a plurality of current-temperature curves (e.g., a group of curves C1 or a group of curves C2 as shown in FIG. 4). The group of curves C1 (one solid curve and two dashed curves as shown in FIG. 4) may represent the trend of the generated electrical current signal Ip and the detected temperature of the temperature sensor 12a when the actual temperature of an object to be detected varies and the distance between the object and the optical module is fixed at 40 mm. For example, one of the curves C1 (i.e., the solid curve) may represent that, when the distance between the semiconductor package and an object is 40 mm, the electrical current signal Ip generated by the temperature sensor 12a appears to decrease from 12.4 nA to −9.0 nA in response to an object with 36° C. when the temperature of the temperature sensor 12a varies from 0° C. to 50° C. The group of curves C2 (one solid curve and two dashed curves as shown in FIG. 4) may represent the trend of the generated electrical current signal Ip and the detected temperature of the temperature sensor 12a when the actual temperature of an object to be detected varies and the distance between the object and the optical module is fixed at 50 mm. For example, one of the curves C2 (i.e., the solid curve) may represent that, when the distance between the semiconductor package and an object is 50 mm, the electrical current signal Ip generated by the temperature sensor 12a appears to decrease from 5.0 nA to −5.0 nA in response to an object with 38° C. when the temperature of the temperature sensor 12a varies from 0° C. to 50° C. A particular current-temperature curves may be selected based on given information during calibration process, including: a distance between the semiconductor package 100 and an object, the temperature of the temperature sensor 12a, and a derived temperature of the object. For example, a point P1 as shown in FIG. 4 indicates a sensing result of an electrical current signal Ip1 in response to an IR emitted by an object and a temperature Ts1 of the temperature sensor 12a measured by the temperature chip 12b1. The actual distance between the object and the semiconductor package 100 may be 50 mm. The point P1 may be closer to the group of the curves C1 than the group of the curves C2. In some comparative embodiments, the point P1 may be wrongly correspond to one of the curves C1 (i.e., the solid curve, the one closest to the point P1 in the group of the curves C1) without considering the distance information. In the present disclosure, the optical module 11 may be configured to measure the distance between the semiconductor package 100 and the object, and transmit the distance information (i.e., 50 mm) to the semiconductor element 12b. As such, one of the curves C2 (i.e., the solid curve, the one closest to the point P1 in the group of the curves C2) would be correctly selected. Furthermore, as mentioned, there may be a slight difference between the temperature Ts1 and the actual temperature of the temperature sensor 12a. Using the distance information may further eliminate the impact of the difference. In some embodiments, the derived temperature of the object is calculated by principal of black body radiation to approach the real temperature of the object.

During the calibration process, the corresponding temperature curve is selected, and the electrical current signal Ip generated by the temperature sensor 12a is set to be zero at the derived temperature Tbb of the object. For example, as shown in FIG. 4, at a derived temperature Tbb of 36° C., the electrical current signals Ip of the solid one of the curves C1 is set to zero. At a derived temperature Tbb of 38° C., the electrical current signals Ip of the solid one of the curves C2 is set to zero Again referring to FIG. 3, the temperature sensor 12a may be configured to detect a radiation L3 from the object 20. The radiation L3 may have a wavelength from 2 µm to about 10 µm. A wavelength range of the radiation L3 is different from that of the light L1 or the light L2. The radiation L3 may represent the temperature of the object 20. The temperature sensor 12a may be configured to detect the temperature of the object 20. The temperature sensor 12a may be configured to generate an electrical current signal in response to the radiation L3. In other words, the electrical current signal may be associated with the temperature of the object 20. The electrical current signal may be transmitted to the semiconductor element 12b.

The optical module 11 may be configured to detect a distance between the semiconductor package 100 and the object 20 based on the light L1 and the light L2. The optical module 11 may be configured to transmit the distance information including the data of the distance to the semiconductor element 12b.

In some comparative embodiments, a temperature sensor may be configured to measure a temperature of an object. The temperature measured by the temperature sensor may vary when the distance between the temperature sensor and the object varies. However, the temperature sensor may be unable to measure a distance between the temperature sensor and the object. As such, the temperature measured by the temperature sensor may not precisely correspond to the actual temperature of the object. The semiconductor package 100 of the present disclosure provides measurement of the temperature of an object with improved accuracy by using the data detected by the optical module 11 and the temperature module 12. Since the components (e.g., the temperature sensor 12a and the semiconductor element 12b) of the temperature module 12 are not sensitive to the wavelength of the lights L1 and L2, the temperature module 12 may be disposed between the components (e.g., the light emitter 11a and the light receiver 11b) of the optical module 11 and serve as a cross-talk inhibitor for the optical module 11. By virtue of the compact arrangement, e.g., disposing the temperature module 12 within the optical module 11, the size of the semiconductor package 100 can be shrunk.

Figure 5:
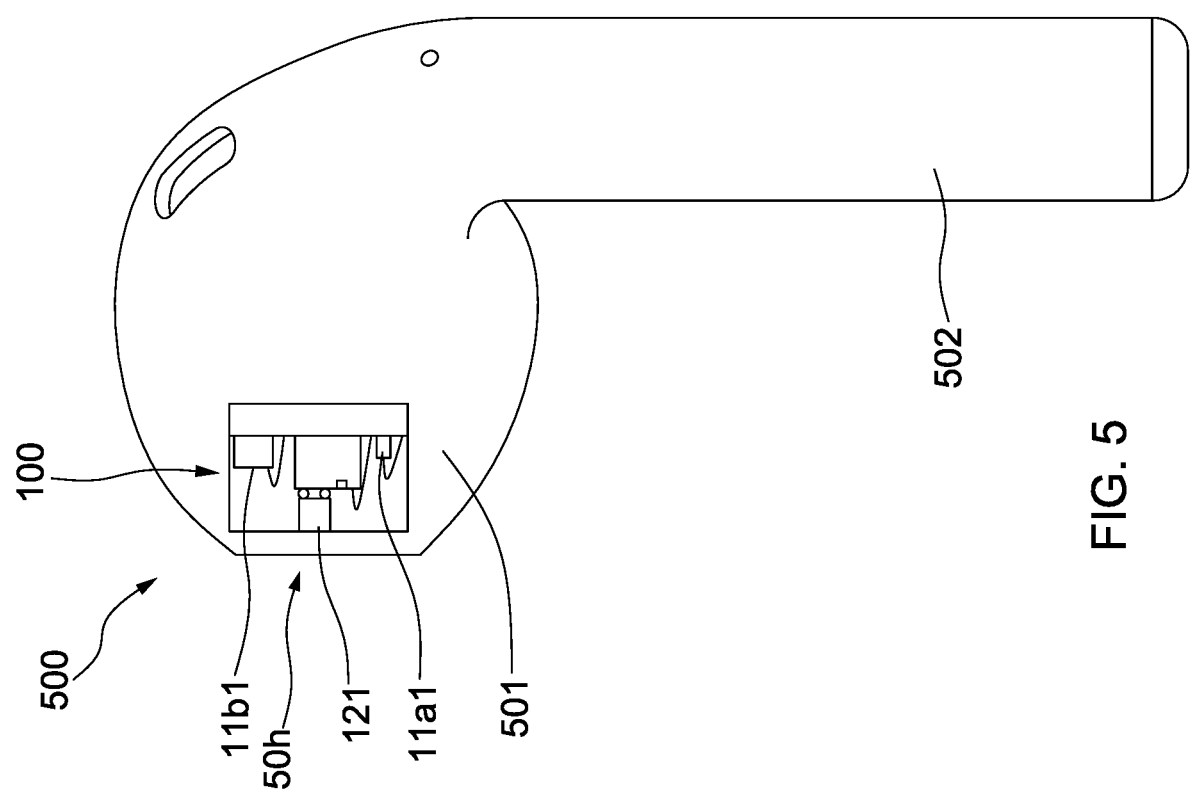
FIG. 5 illustrates a wearable device according to some embodiments of the present disclosure.
Figure 6:
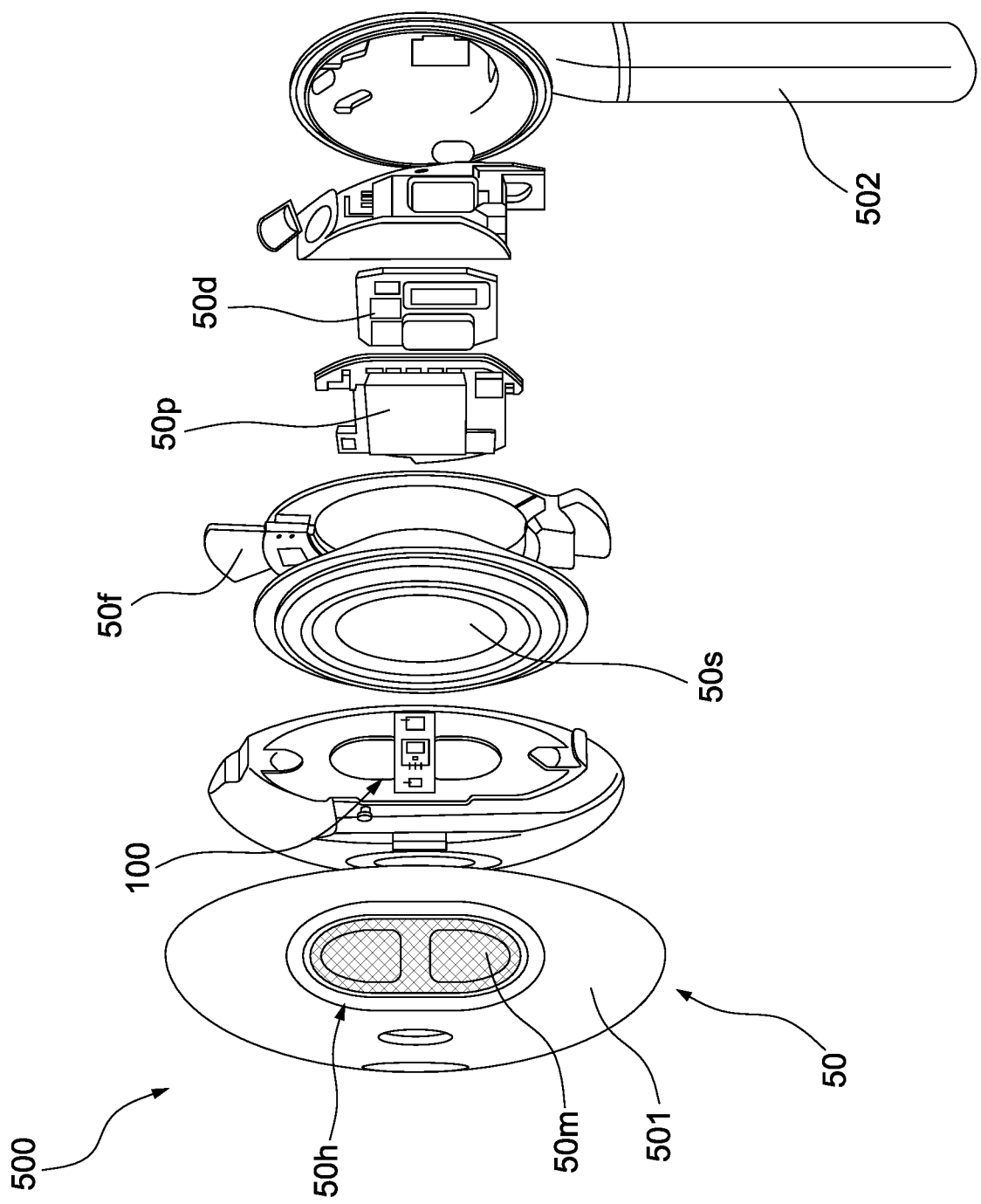
FIG. 6 illustrates an exploded view of a wearable device according to some embodiments of the present disclosure.

FIG. 5 illustrates a wearable device 500 according to some embodiments of the present disclosure. FIG. 6 illustrates an exploded view of the wearable device 500 according to some embodiments of the present disclosure. The wearable device 500 may include a housing 50 and a semiconductor package (e.g., the semiconductor package 100 in FIG. 1). The housing 50 may include a top portion 501 and a tail portion 502 connected to the top portion 501. The semiconductor package 100 may be located at the top portion 501. The housing 50 may have an opening 50h. The sensing surface 11a1/11b1 of the optical module 11 and the sensing surface 121 of the temperature module 11 may face the opening 50h of the housing 50. The sensing surface 121 of the temperature module 12 may be closer to the opening 50h than the sensing surface 11a1/11b1 of the optical module 11. The top portion 501 may be closer to user's body part than the tail portion 502 when worn. For example, the top portion 501 may be partially put in a user's ear canal. The opening 50h may face the user's eardrum.

Referring to FIG. 6, the wearable device 500 may include a speaker mesh 50m, a speaker 50s, a frame 50f, a processor 50p, and a battery 50b. The speaker mesh 50m may be disposed in the opening 50h. The sensing surface 11a1/11b1 of the optical module 11 and the sensing surface 121 of the temperature module 11 may face the speaker mesh 50m. The speaker 50s may be disposed on the frame 50f. The speaker 50s may be disposed adjacent to the substrate 10 of the semiconductor package 100. The speaker 50s and the speaker mesh 50m may be substantially aligned. The processor 50p may be configured to control the speaker 50s, the battery 50b, and the semiconductor package 100. The processor 50p may include an integrated circuit.

The temperature module 12 may be configured to detect a temperature of an object through the opening 50h, and the optical module 11 may be configured to detect a distance between the optical module 11 and the object. For example, the temperature module 12 may be configured to measure the temperature of a user's eardrum and the optical module 11 may be configured to measure the distance between the optical module 11 and the user's eardrum. The temperature module 12 may be configured to calibrate the detected temperature of the object based on the data associated with the detected temperature of the object, the detected temperature of the temperature sensor, and the data of the detected distance.

In some comparative embodiments, a wearable device may include a temperature sensor and a proximity sensor. The proximity sensor may face the wall of a user's ear canal. The proximity sensor may not be able to provide distance information for the calibration of the temperature detected by the temperature sensor. In the present disclosure, the optical module 11 and the temperature module 12 have sensing surfaces facing the same direction. The distance information measured by the optical module 11 can be used for calibration of the temperature measured by the temperature module 12.

Figure 7:
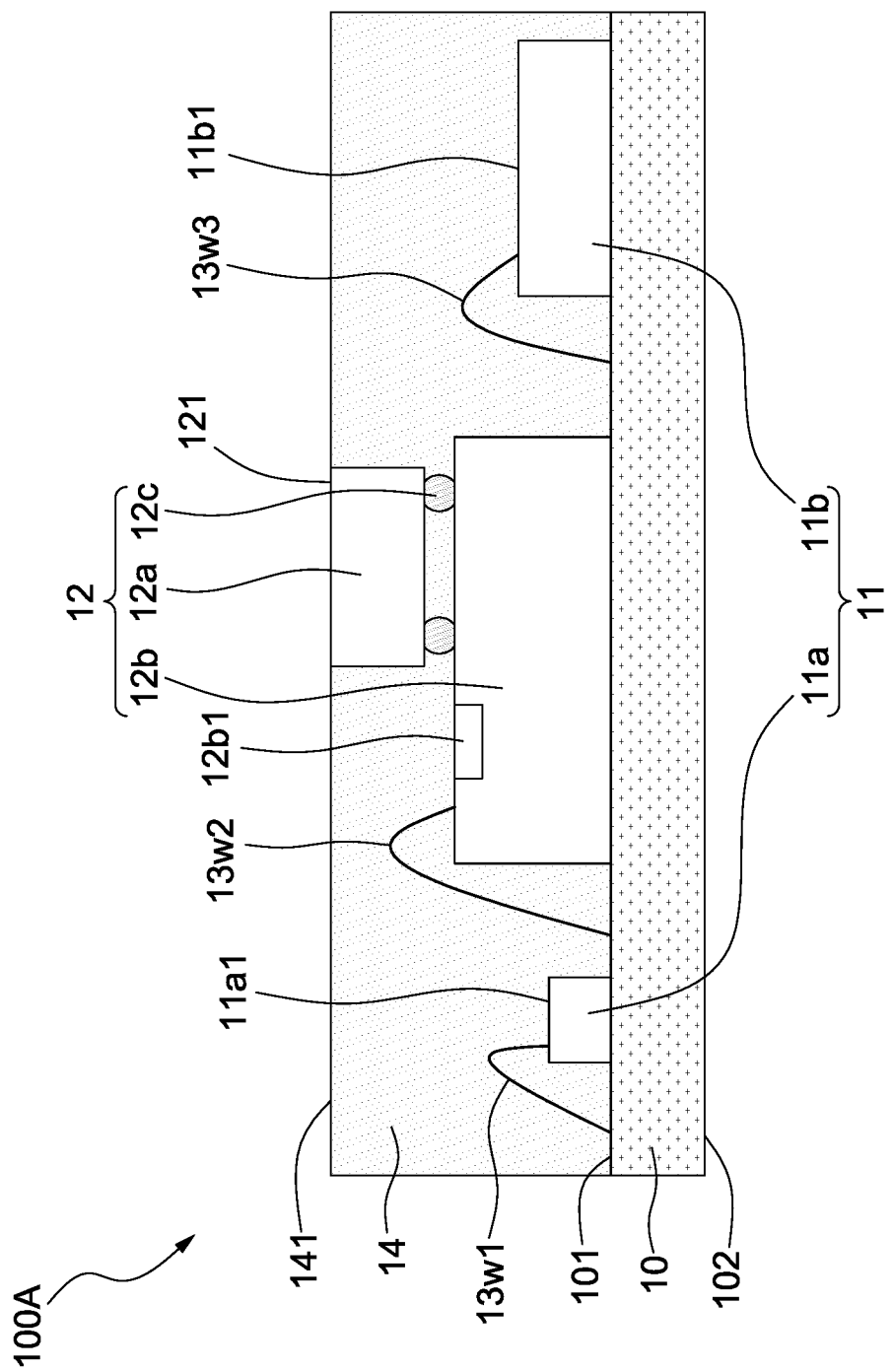
FIG. 7 illustrates a cross-sectional view of a semiconductor package according to some embodiments of the present disclosure.

FIG. 7 illustrates a cross-sectional view of a semiconductor package 100A according to some embodiments of the present disclosure. The semiconductor package 100A of FIG. 7 is similar to the semiconductor package 100 of FIG. 1 and FIG. 2, and the differences therebetween are described below.

The top surface 141 of the encapsulant 14 of the semiconductor package 100A and the sensing surface 121 of the temperature module 12 may be substantially coplanar. The sensing surface 121 may be exposed from the top surface 141 of the encapsulant. In some embodiments, a top surface of the temperature sensor 12a may be exposed from the encapsulant 14. The temperature module 12 may be configured to directly receive radiation from an object to be detected.

Figure 8:
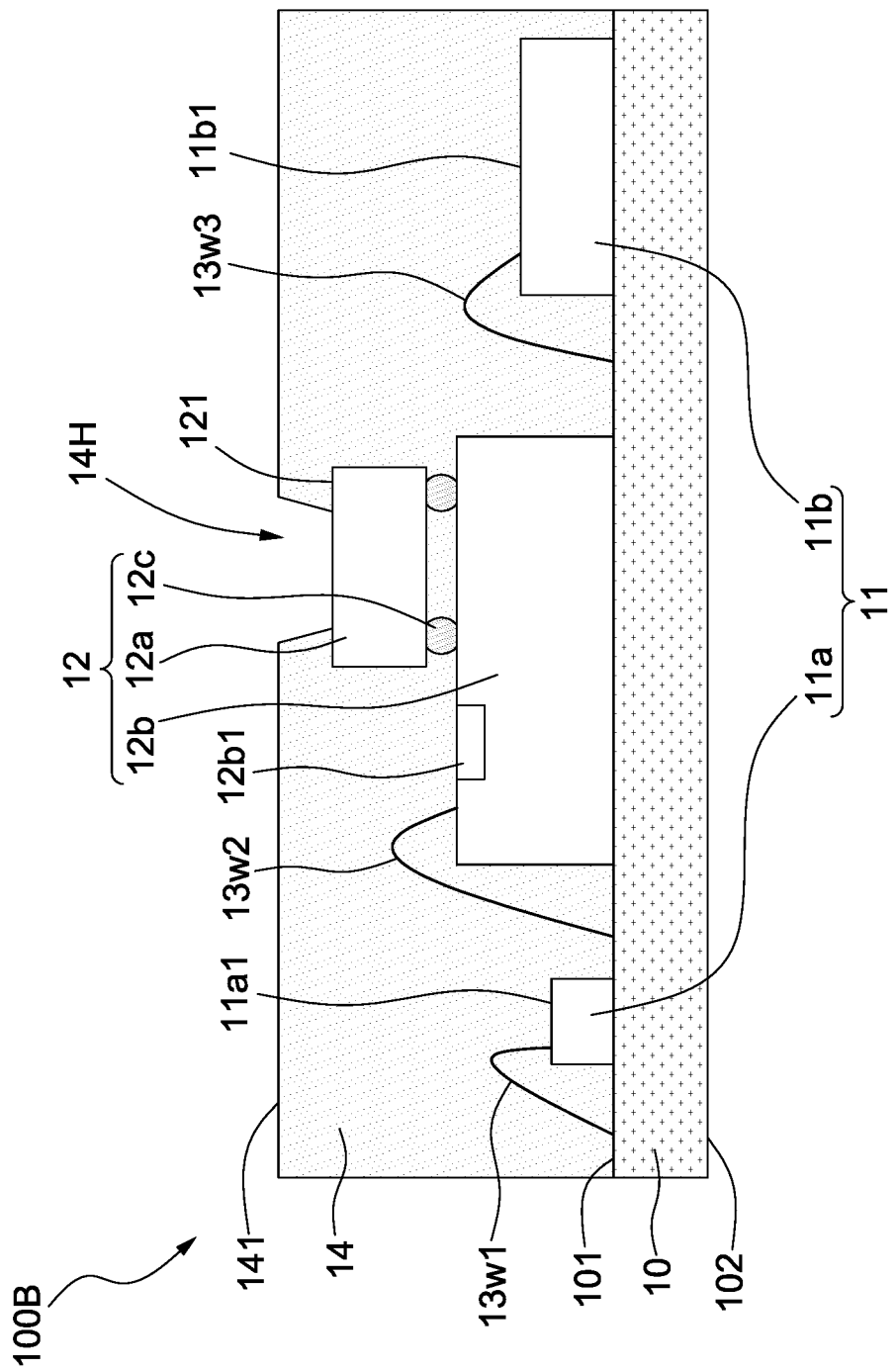
FIG. 8 illustrates a cross-sectional view of a semiconductor package according to some embodiments of the present disclosure.

FIG. 8 illustrates a cross-sectional view of a semiconductor package 100B according to some embodiments of the present disclosure. The semiconductor package 100B of FIG. 8 is similar to the semiconductor package 100 of FIG. 1 and FIG. 2, and the differences therebetween are described below.

The encapsulant 14 of the semiconductor package 100B may define an opening 14H from the top surface 141 of the encapsulant 14 to expose the temperature sensor 12a of the temperature module. The temperature sensor 12a may be configured to directly receive radiation from an object to be detected.

Figure 9:
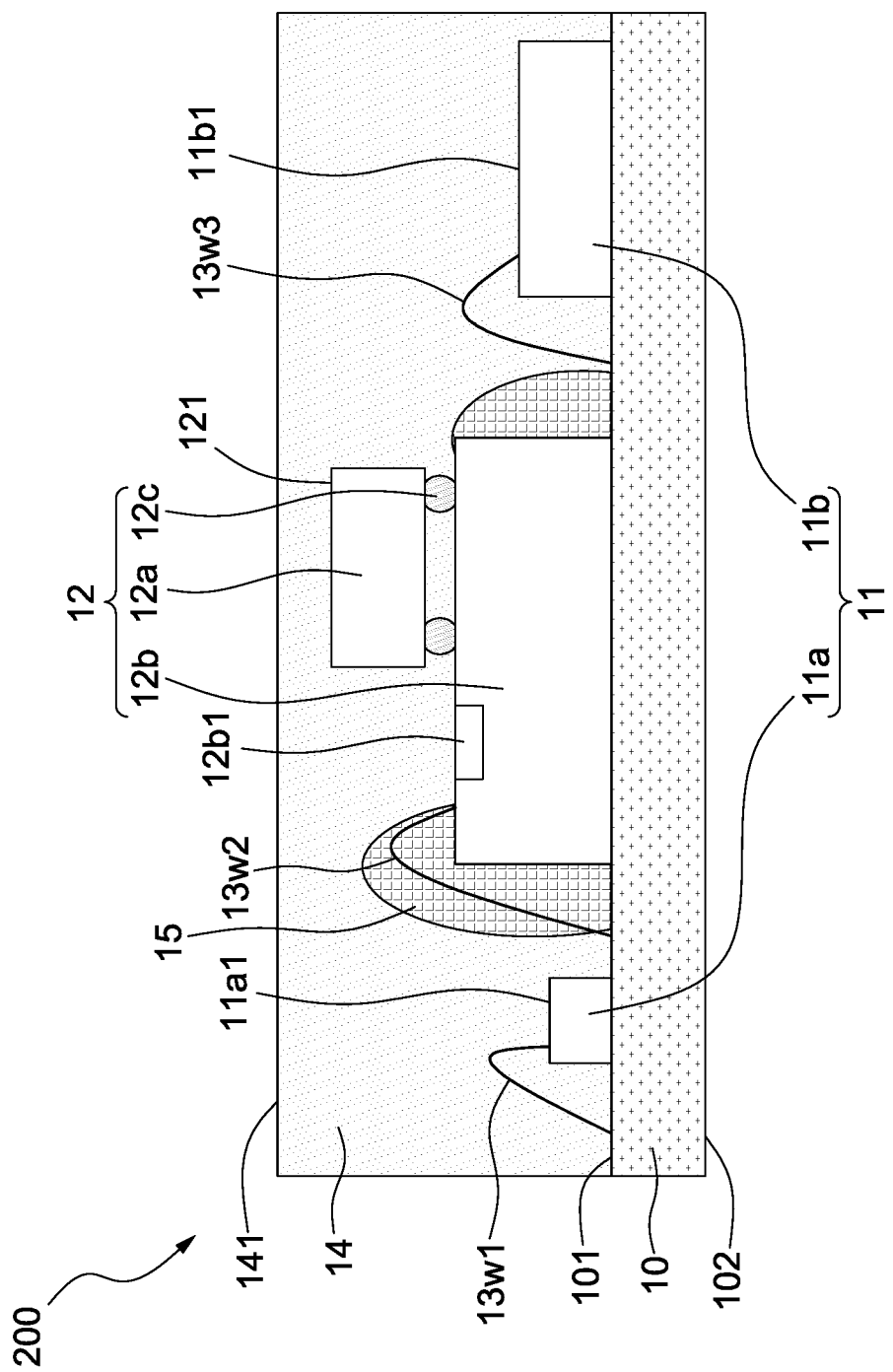
FIG. 9 illustrates a cross-sectional view of a semiconductor package according to some embodiments of the present disclosure.
Figure 10:
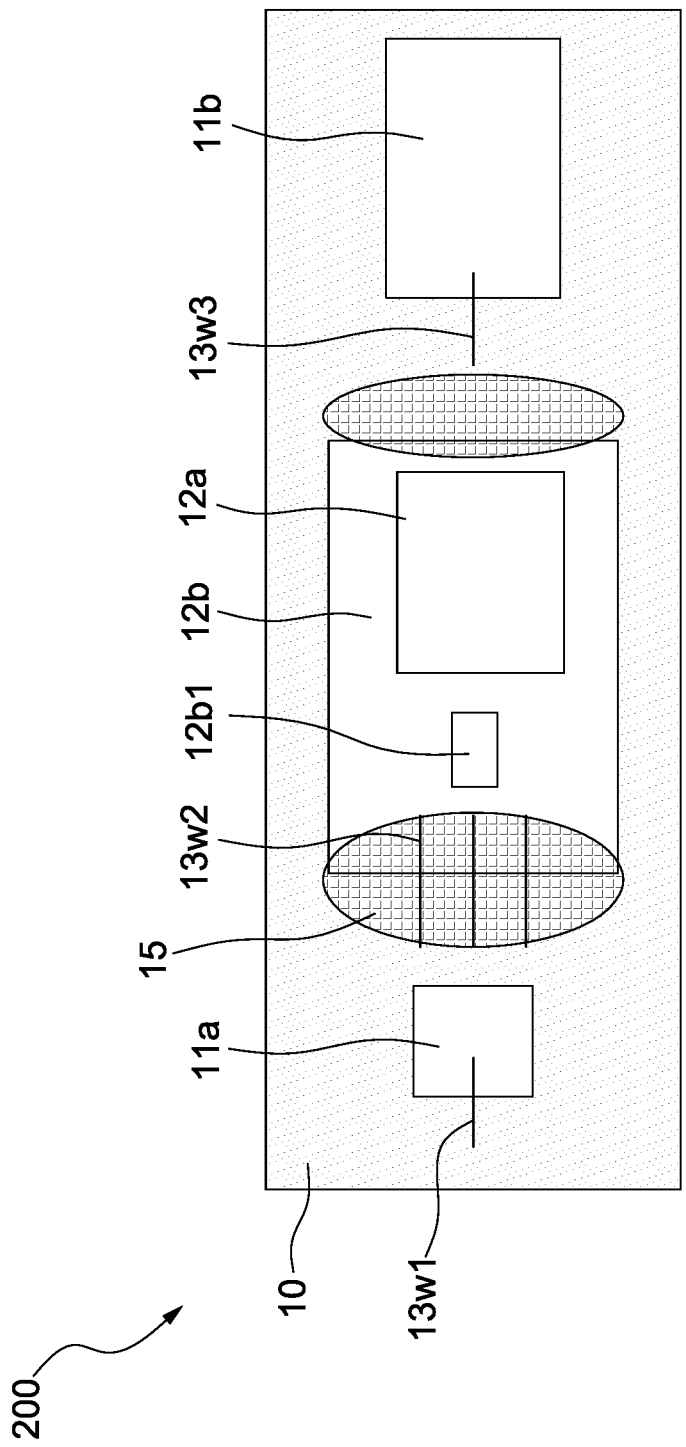
FIG. 10 illustrates a top view of a semiconductor package according to some embodiments of the present disclosure.

FIG. 9 illustrates a cross-sectional view of a semiconductor package 200 according to some embodiments of the present disclosure. FIG. 10 illustrates a top view of the semiconductor package 200 according to some embodiments of the present disclosure. The semiconductor package 200 of FIG. 9 and FIG. 10 is similar to the semiconductor package 100 of FIG. 1 and FIG. 2, and the differences therebetween are described below.

The semiconductor package 200 may further include an encapsulant 15 surrounding the temperature module 12. The encapsulant 15 may be disposed between the temperature module 12 and the optical module 11. The material of the temperature module 12 may include a silicon, which has a high light transmission coefficient for the light with wavelength from about 0.8 μm to about 1.5 μm. In some cases, a portion of the light emitted by the light emitter 11a may pass through the temperature module 12, and then the portion of the light may be received by the light receiver 11b. The encapsulant 15 disposed between the temperature module 12 and the optical module 11 (i.e., the light emitter 11a and the light receiver 11b) may have a light transmission coefficient lower than that of the temperature module 12. The encapsulant 15 may be configured to absorb a light from the optical module 11. The encapsulant 15 may be configured to prevent the light emitted by the light emitter 11a from reaching the light receiver 11b. In some embodiments, a light transmission coefficient of the encapsulant 14 may be greater than a light transmission coefficient of the encapsulant 15. The encapsulant 15 may cover the wire 13w2. The encapsulant 15 may cover sidewalls of the semiconductor element 12b facing the light emitter 11a and the light receiver 11b.

The encapsulant 15 may include an epoxy resin with fillers, a molding compound (e.g., an epoxy molding compound or other molding compound), a polyimide, a phenolic compound or material, a material with a silicone dispersed therein, or a combination thereof.

Figure 11:
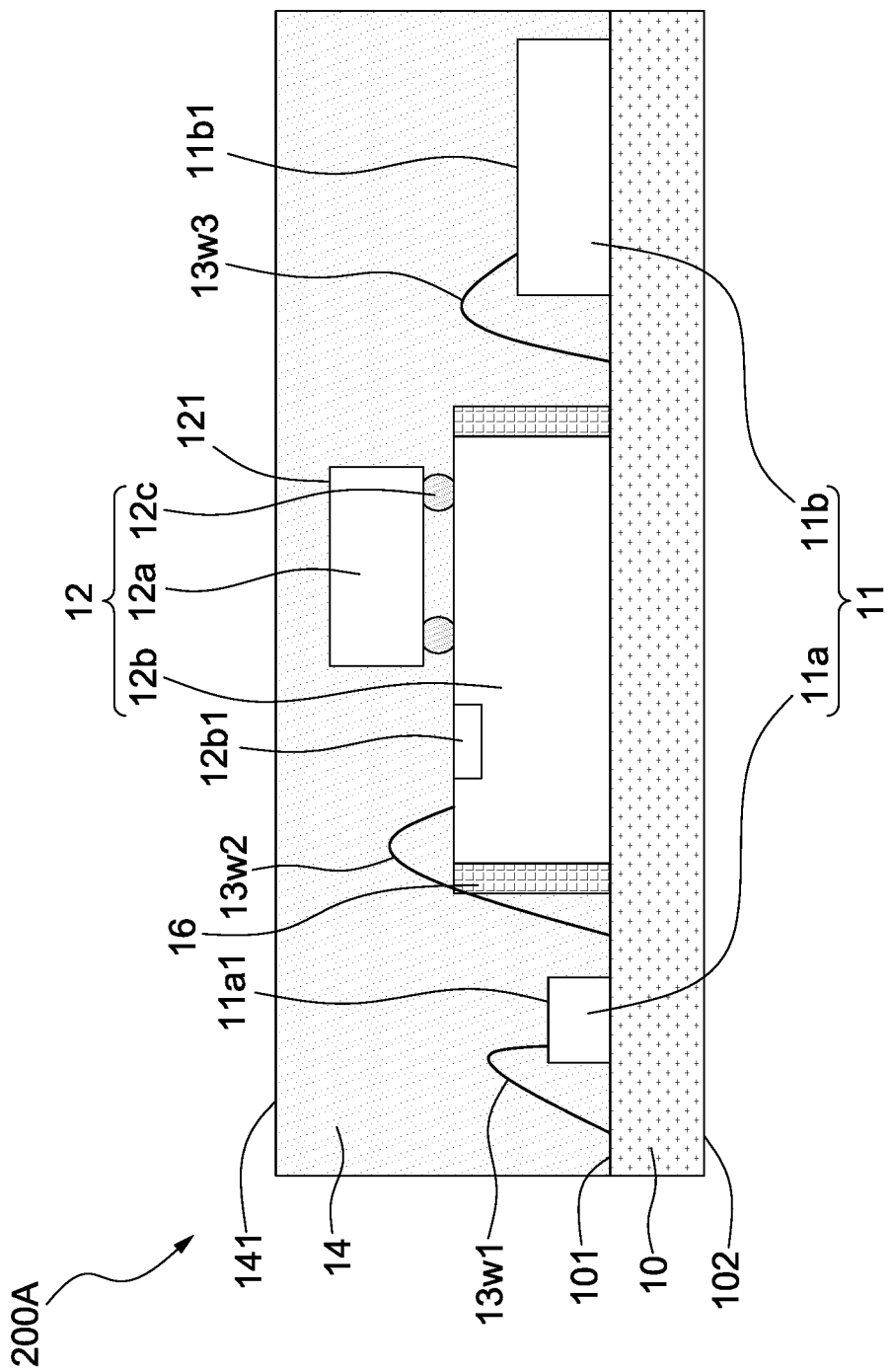
FIG. 11 illustrates a cross-sectional view of a semiconductor package according to some embodiments of the present disclosure.
Figure 12:
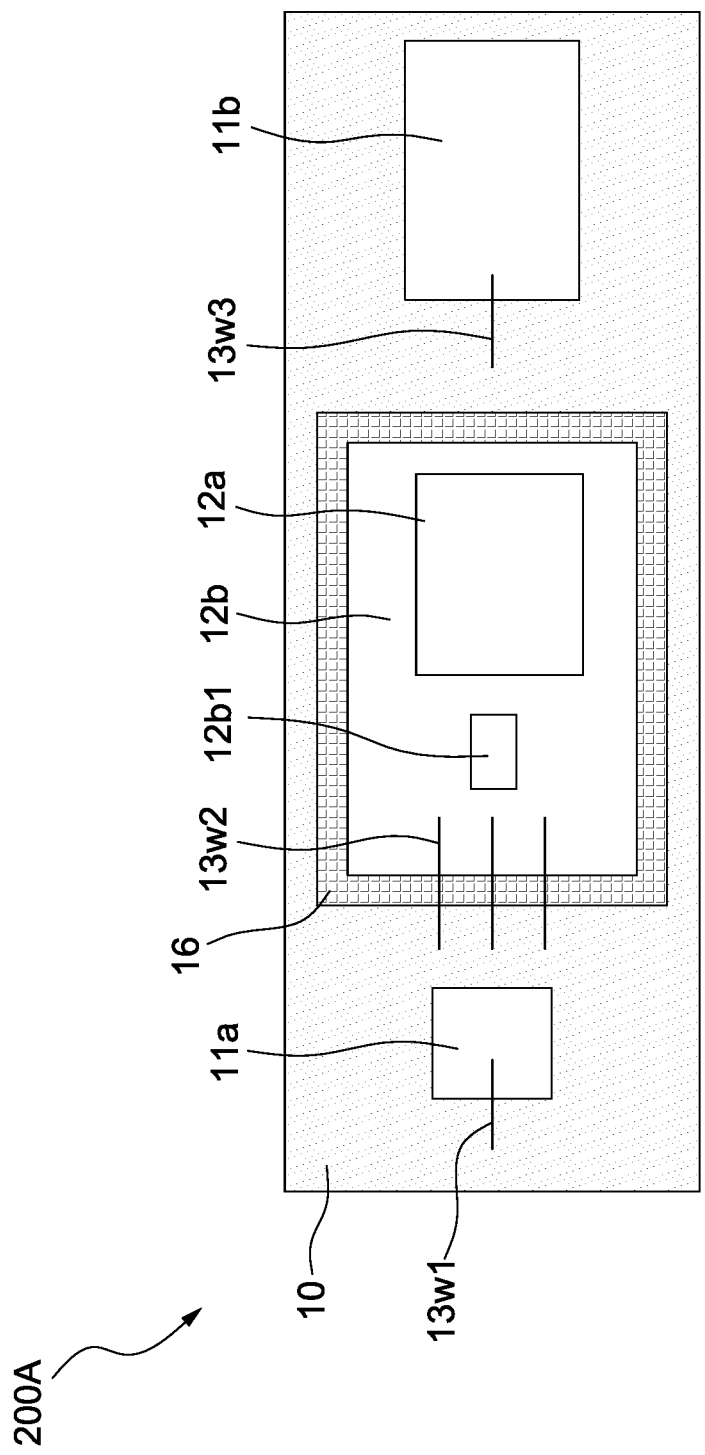
FIG. 12 illustrates a top view of a semiconductor package according to some embodiments of the present disclosure.

FIG. 11 illustrates a cross-sectional view of a semiconductor package 200A according to some embodiments of the present disclosure. FIG. 12 illustrates a top view of the semiconductor package 200A according to some embodiments of the present disclosure. The semiconductor package 200A of FIG. 11 and FIG. 12 is similar to the semiconductor package 100 of FIG. 1 and FIG. 2, and the differences therebetween are described below.

The semiconductor package 200A may further include an encapsulant 16 surrounding the semiconductor element 12b of the temperature module 12. The encapsulant 16 may be disposed between the temperature module 12 and the optical module 11. A light transmission coefficient of the encapsulant 14 may be greater than a light transmission coefficient of the encapsulant 16. The encapsulant 16 may be configured to absorb a light from the optical module 11. The encapsulant 16 may be configured to prevent the light emitted by the light emitter 11a from reaching the light receiver 11b. The encapsulant 16 may cover the wire 13w2. The encapsulant 16 may cover all of the sidewalls of the semiconductor element 12b.

The encapsulant 16 may include an epoxy resin with fillers, a molding compound (e.g., an epoxy molding compound or other molding compound), a polyimide, a phenolic compound or material, a material with a silicone dispersed therein, or a combination thereof.

Figure 13:
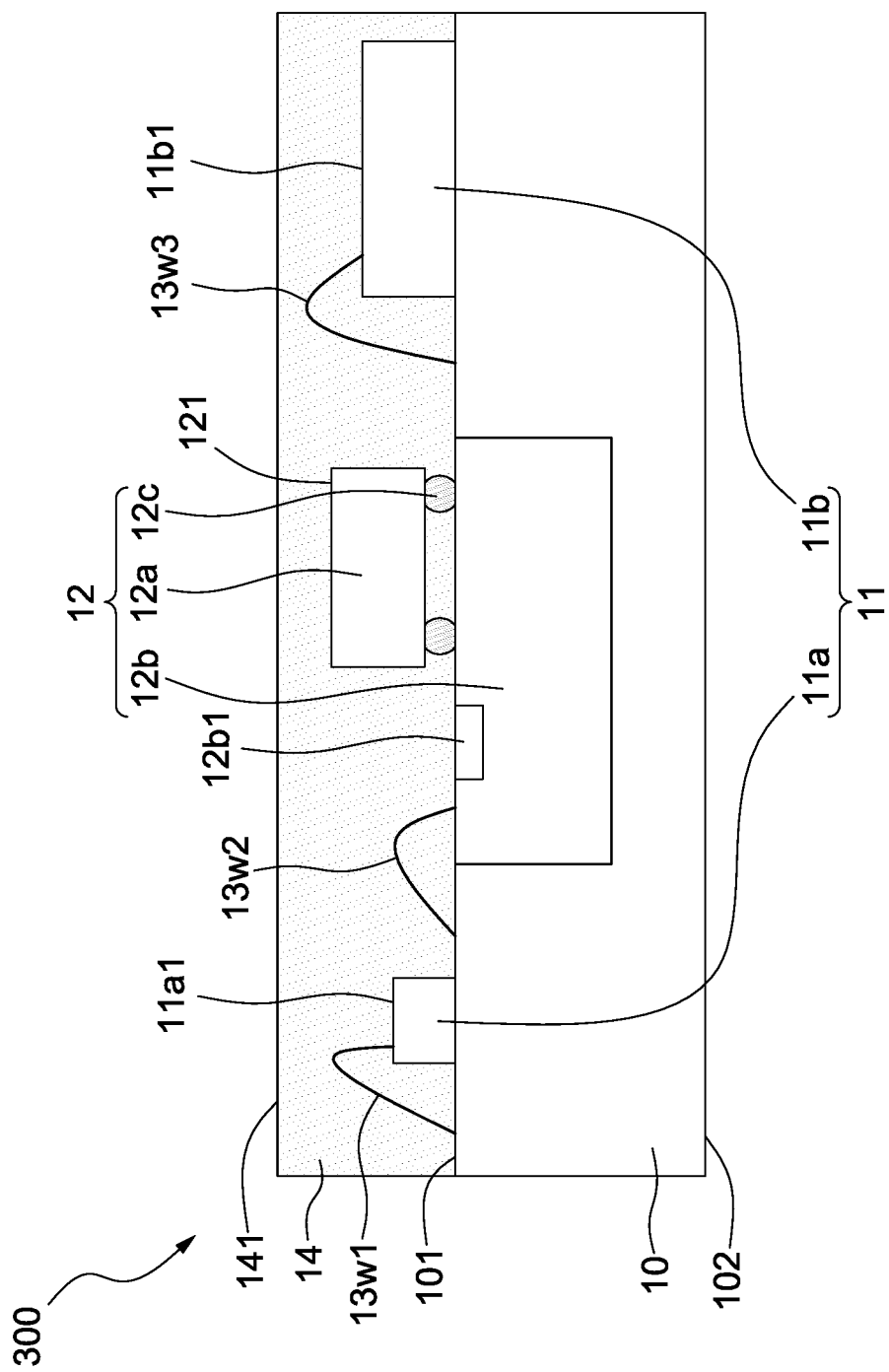
FIG. 13 illustrates a cross-sectional view of a semiconductor package according to some embodiments of the present disclosure.

FIG. 13 illustrates a cross-sectional view of a semiconductor package according to some embodiments of the present disclosure. The semiconductor package 300 of FIG. 13 is similar to the semiconductor package 100 of FIG. 1 and FIG. 2, and the differences therebetween are described below.

The semiconductor element 12b of the semiconductor package 300 may be embedded in the substrate 10. The temperature sensor 12a may have a height which is enough to prevent the light emitted by the light emitter 11a from reaching the light receiver 11b.

Figure 14:
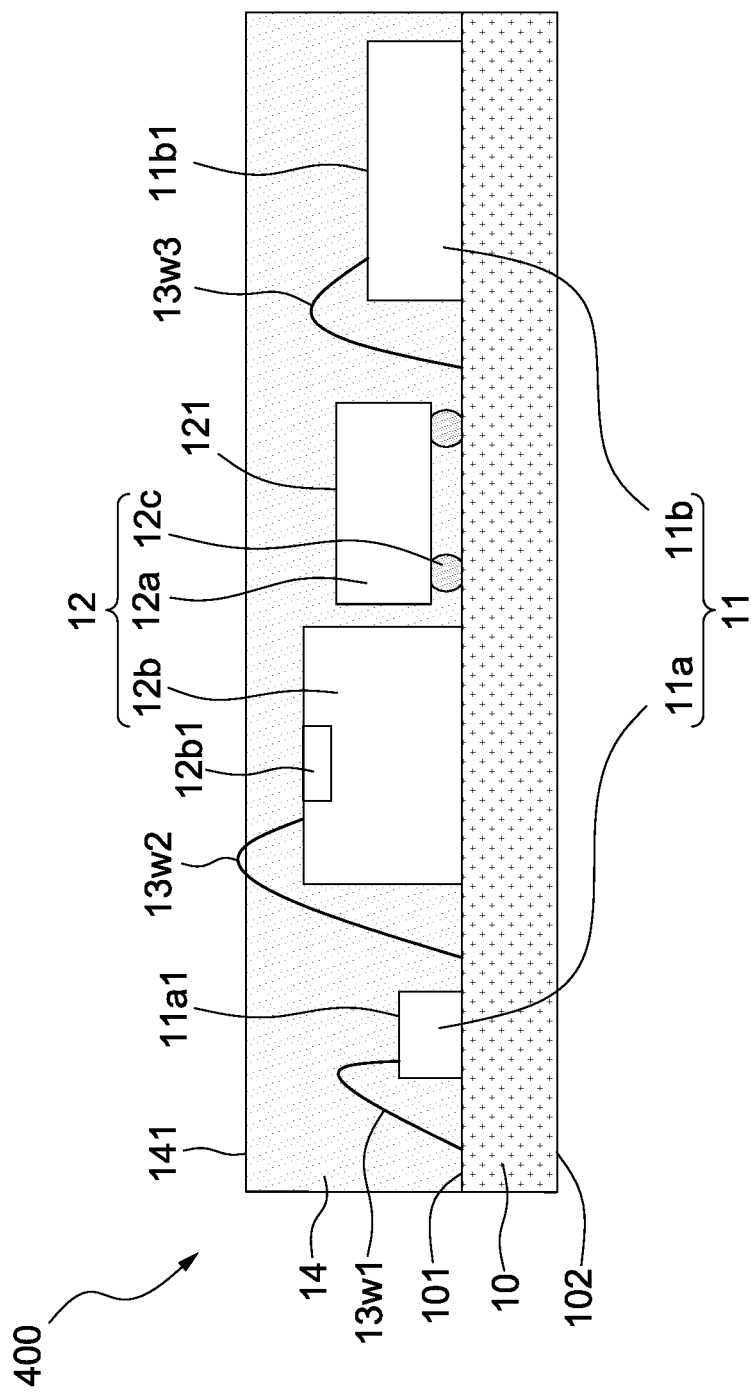
FIG. 14 illustrates a cross-sectional view of a semiconductor package according to some embodiments of the present disclosure.

FIG. 14 illustrates a cross-sectional view of a semiconductor package according to some embodiments of the present disclosure. The semiconductor package 400 of FIG. 14 is similar to the semiconductor package 100 of FIG. 1 and FIG. 2, and the differences therebetween are described below.

The temperature sensor 12a and the semiconductor element 12b may be disposed side-by-side. A lateral distance between the temperature sensor 12a and the semiconductor element 12b may be sufficiently close to allow the temperature detected by the temperature chip 12b1 representative to the temperature of the temperature sensor 12a. The temperature sensor 12a may have a height which is enough to prevent the light emitted by the light emitter 11a from reaching the light receiver 11b. The semiconductor element 12b may have a height which is enough to prevent the light emitted by the light emitter 11a from reaching the light receiver 11b.

Figure 15:
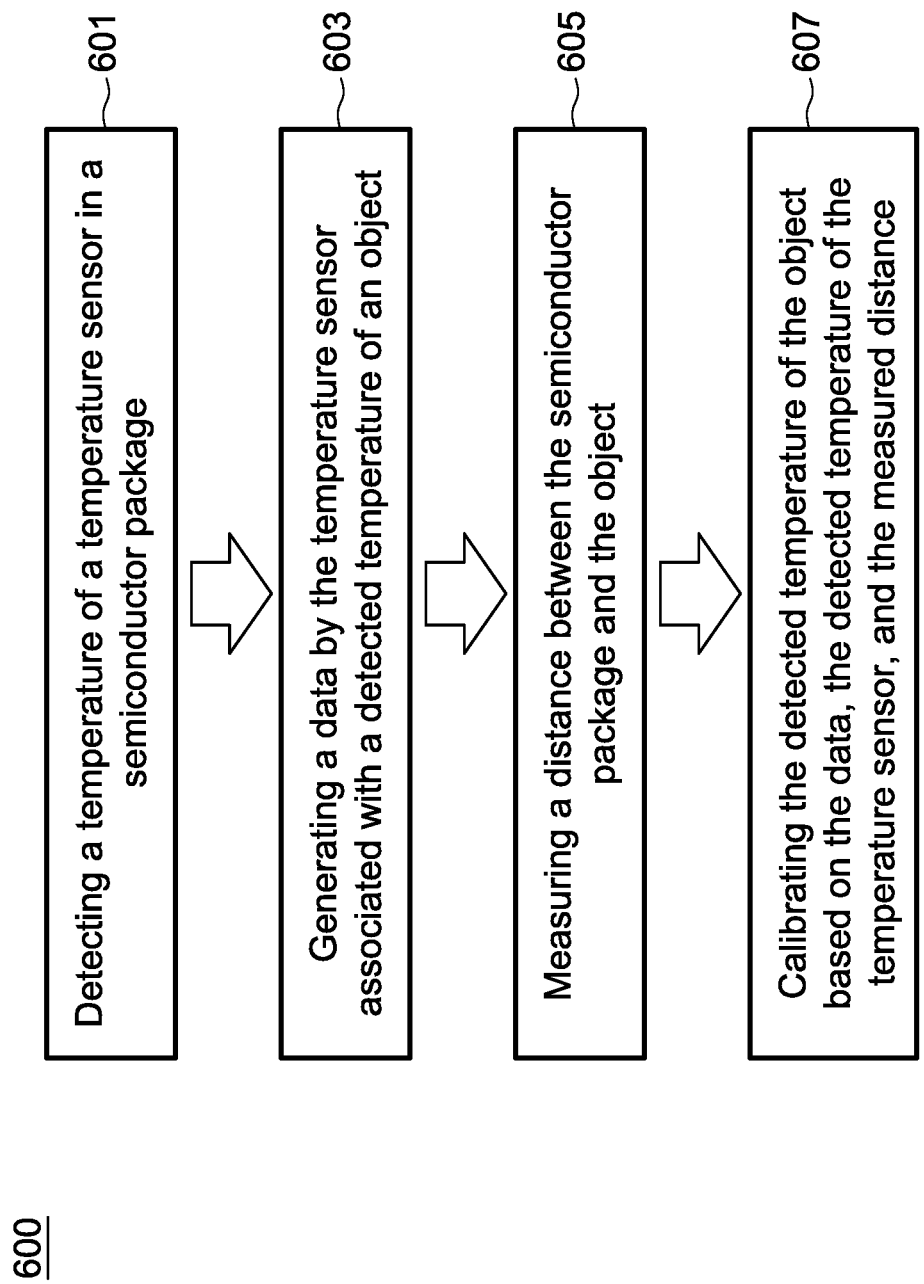
FIG. 15 illustrates a flow chart of a temperature detection method according to some embodiments of the present disclosure.

FIG. 15 illustrates a flow chart of a temperature detection method 600 according to some embodiments of the present disclosure. The temperature detection method 600 may include Steps 601, 603, 605, and 607. The temperature detection method 600 may be operated by the semiconductor package 100, 100A, 100B, 200, 200A, 300, or 400.

In Step 601, a temperature of a temperature sensor (e.g., the temperature sensor 12a) may be detected by a temperature chip (e.g., the temperature chip 12b1). That is, the temperature chip 12b1 disposed sufficiently close to the temperature sensor 12a so that the temperature detected by the temperature chip 12b1 is representative to the physical temperature of the temperature sensor 12a. The temperature sensor and the temperature chip are integrated in a semiconductor package.

In Step 603, a data (e.g., electrical signal) may be generated by the temperature sensor (e.g., the temperature sensor 12a) associated with a temperature of an object to be detected. For example, the object to be detected may possess a temperature T1, and the electrical signal generated in the temperature sensor may be at a close but different temperature T2. The temperature T2 sensed by the temperature sensor 12a is associated with the temperature T1 of the object to be detected.

In Step 605, a distance between the semiconductor package and the object may be measured by an optical module in the semiconductor package. In some embodiments, the optical module can be a proximity sensor described herein.

In Step 607, the detected temperature of the object may be calibrated based on the data (e.g., electrical signal), the detected temperature of the temperature sensor, and the measured distance between the semiconductor package and the object to be detected. In some embodiments, calibrating the detected temperature of the object may include selecting a current-temperature curve based on the measured distance.

Spatial descriptions, such as "above," "below," "up," "left," "right," "down," "top," "bottom," "vertical," "horizontal," "side," "higher," "lower," "upper," "over," "under,"

and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a substrate;
   a temperature module disposed on the substrate;
   a first light absorbing material in direct contact with a first portion of the temperature module;
   a transparent material in direct contact with a second portion of the temperature module different from the first portion;
   a second light absorbing material in direct contact with a third portion of the temperature module different from the first portion and the second portion; and
   a light emitter and a light receiver disposed on the substrate,
   wherein the first light absorbing material is in direct contact with the transparent material,
   wherein the first light absorbing material has a top surface and a lateral surface, both of which are in contact with the transparent material,
   wherein the second light absorbing material is separated and spaced apart from the first light absorbing material, and wherein, in a cross-sectional view, the first light absorbing material is higher than the second light absorbing material with respect to the temperature module,
   wherein a width of the first portion is different from a width of the third portion,
   wherein a first volume of the first light absorbing material is different from a second volume of the second light absorbing material, and
   wherein the first volume is larger than the second volume, and wherein the first light absorbing material is adjacent to the light emitter and the second light absorbing material is adjacent to the light receiver.

2. The semiconductor package of claim 1, further comprising a first wiring having a first section covered by the first light absorbing material and a second section covered by the transparent material.

3. The semiconductor package of claim 2, wherein the second section is closer to the substrate than to the temperature module.

4. The semiconductor package of claim 1, wherein, in a top view, the transparent material covers a first pair of opposite sidewalls and the first light absorbing material covers a sidewall different from the first pair of opposite sidewalls.

5. The semiconductor package of claim 1, wherein the first light absorbing material has a curved shape and the transparent material has a rectangular shape.

* * * * *